United States Patent [19]
Callaway, Jr. et al.

[11] Patent Number: 5,631,924
[45] Date of Patent: May 20, 1997

[54] METHOD AND APPARATUS FOR BAUD RATE DETECTION IN AN FM RECEIVER USING PARAMETERS UNRELATED TO BAUD RATE AS CONFIRMATION

[75] Inventors: Edgar H. Callaway, Jr., Boca Raton; Frederick L. Kampe, Boynton Beach, both of Fla.

[73] Assignee: Motorola, Inc., Schaumburg, Ill.

[21] Appl. No.: 491,827

[22] Filed: Jun. 19, 1995

[51] Int. Cl.⁶ .................................... H04B 17/00
[52] U.S. Cl. ................ 375/225; 375/340; 455/343
[58] Field of Search .................... 375/225, 222, 375/340, 342, 357, 365, 366, 377, 326, 317, 346, 344; 341/61; 358/486; 370/84, 102, 100.1, 105.4, 105.3; 364/166; 455/33.1, 34.1, 31.1, 343, 68, 44, 226.1; 329/315

[56] References Cited

U.S. PATENT DOCUMENTS

| | | | |
|---|---|---|---|
| 3,747,074 | 7/1973 | Schulze | 370/84 |
| 3,775,751 | 11/1973 | Anderson | 395/550 |
| 4,218,769 | 8/1980 | Cagle | 375/342 |
| 4,225,964 | 9/1980 | Cagle et al. | 375/332 |
| 4,653,116 | 3/1987 | Lindenmeier et al. | 455/205 |
| 4,823,387 | 4/1989 | Tults | 380/13 |
| 5,008,902 | 4/1991 | Key et al. | 375/225 |
| 5,095,498 | 3/1992 | DeLuca et al. | 375/340 |
| 5,163,050 | 11/1992 | Cromack | 370/110.3 |
| 5,555,452 | 9/1996 | Callaway, Jr. et al. | 455/266.2 |
| 5,563,910 | 10/1996 | Mellone et al. | 375/225 |

Primary Examiner—Wellington Chin
Assistant Examiner—William Luther
Attorney, Agent, or Firm—D. Andrew Floam

[57] ABSTRACT

A method for determining whether a baud rate of a frequency modulated (FM) signal received by a receiver matches a predetermined baud rate. A parameter other than the baud rate is detected and used to confirm whether baud rate detection should be made, or whether if made, is reliable. The parameter is frequency deviation of the received FM signal, or other suitable parameters of the received FM signal.

19 Claims, 5 Drawing Sheets

METHOD AND APPARATUS FOR BAUD RATE DETECTION IN AN FM RECEIVER USING PARAMETERS UNRELATED TO BAUD RATE AS CONFIRMATION

FIELD OF THE INVENTION

This invention relates in general to the field of frequency modulation (FM) radio frequency communication receivers, and more particularly to an improved method for baud rate detection.

BACKGROUND OF THE INVENTION

The baud rate of a signal received by a receiver is determined and compared with a predetermined baud rate in order to assess whether the received signal is the proper or desired signal for subsequent processing, such as decoding the digital data carried by the signal. In portable communication receivers, prolonging the life of a battery used to power the device is a major challenge. Certain baud detection techniques are known in the art to accurately determine whether the baud rate of the received signal matches the predetermined baud rate.

However, there is room for improvement and particularly it is desirable to use other information about the received signal to minimize false baud rate detections and also minimize battery drain in the receiver.

DETAILED DESCRIPTION OF THE DRAWINGS

Figure 1:
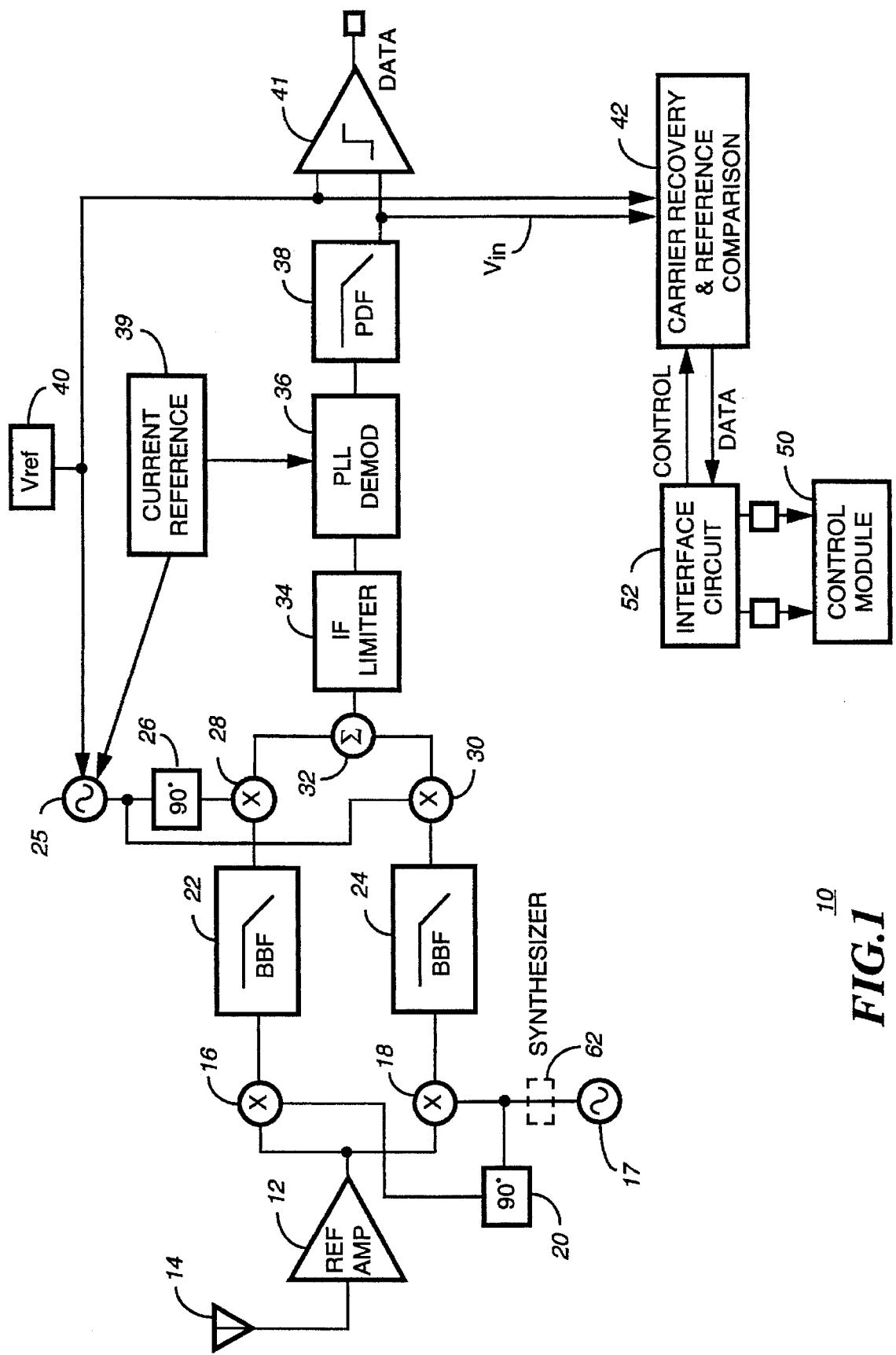
FIG. 1 is an electrical block diagram of a receiver circuit according to the present invention.

Referring to FIG. 1, a receiver circuit is shown generally at 10. The baud detection method according to the present invention is useful in any type of a receiver circuit which receives a frequency modulation (FM) signal and which can supply other information about the received signal. One example of a receiver circuit to which the baud detection method of the present invention applies is shown in FIG. 1.

FIG. 1 illustrates a zero-intermediate frequency ("zero-IF") receiver circuit 10. The zero-IF receiver circuit 10 is referred to hereinafter as ZIF (standing for "Zero-IF") receiver circuit 10, for simplicity, and is a Barber type receiver circuit. The ZIF receiver circuit 10 (not necessarily including the control module 50 described hereinafter) is preferably fabricated as a single integrated circuit (IC).

The ZIF receiver circuit 10 comprises a radio frequency (RF) amplifier 12 for amplifying a signal detected by an antenna 14. A first local oscillator 17 is provided to generate a first local oscillator signal for a pair of mixers 16 and 18, and a 90° phase shifter 20.

Specifically, mixer 16 mixes the amplified RF signal with the 90° phase shifted version of the first local oscillator signal, to ultimately recover an in-phase (I) component of the received signal. Mixer 18 mixes the amplified RF signal with the first local oscillator signal to ultimately recover a quadrature (Q) component of the received signal. The frequency of the first local oscillator signal is, for example, 150 MHz, in the case of a VHF selective call receiver. The outputs of the mixers 16 and 18 are coupled to base band filters (BBF's) 22 and 24, respectively.

A second pair of mixers is provided which is driven by a second local oscillator 25 and comprises a 90° phase shifter 26 and mixers 28 and 30, for the I and Q components respectively. The outputs of the BBF's 22 and 24 are connected to the inputs of the mixers 28 and 30, respectively. In the second mixing stage, the I and Q base band components are mixed up in frequency by mixers 28 and 30, and added by summing circuit 32 to generate an intermediate frequency signal for demodulation. In the example of a selective call receiver, a typical frequency of the second local oscillator circuit 25 is 50 kHz.

An IF limiter 34 is connected to the output of the summing circuit 32 to amplify the intermediate frequency signal and generate a limited output.

A phase locked loop demodulator 36 is connected to the output of the IF limiter 34 and demodulates the output signal of the IF limiter 34 to recover the frequency modulated signal, which is ultimately filtered by the post detection filter (PDF) 38. The output of the phase locked loop demodulator 36 is the unfiltered recovered audio signal. The output of the PDF 38 is the recovered audio signal, represented as Vin.

A voltage reference (Vref) 40 provides a voltage reference signal for the second local oscillator 25, the data limiter 41 and the carrier recovery and reference comparison circuit 42.

A current reference circuit 39 provides a current reference signal to the second local oscillator 25 and the phase locked loop demodulator 36.

The output of the PDF 38 is coupled to a data limiter 41 and to a carrier recovery and reference comparison circuit 42. The data limiter 41 compares the recovered audio signal Vin with reference voltage (Vref) 40 and generates as output SIGNAL DATA, which corresponds to the binary data that was transmitted.

The SIGNAL DATA is also coupled to the control module 50 and monitored by the control module 50, as explained below, to determine whether the baud rate of the modulated RF signal, as represented by the SIGNAL DATA, is substantially equal to a predetermined baud rate.

The carrier recovery and comparison circuit 42 is also coupled to the output of the PDF 38 and uses Vref 40 to determine the PEAK and VALLEY levels of the recovered modulation. The PEAK and VALLEY levels are then used to determine the frequency deviation of the received signal. The frequency deviation computation is performed in the carrier recovery and reference comparison circuit 42, or optionally in the control module 50, to be explained below.

The output of the carrier recovery and reference comparison circuit 42 is denoted CARRIER RECOVERY DATA and includes the PEAK and VALLEY levels and/or the frequency deviation information.

A control module 50 is provided which receives as input through an interface circuit 52, the outputs of the data limiter 41, and the outputs of the carrier recovery and reference comparison circuit 42. The control module 50 issues control commands back to certain circuits through the interface circuit 52.

The control module 50 is, for example, a microprocessor controller, such as a Motorola MC68HC05. In this case, the interface circuit 52 is compatible with a serial peripheral interface (SPI) used in conjunction with the microprocessor controller. Other type of controllers are also useful including other digital or analog controllers. The control module 50 is also useful to perform other computational functions, such as computing the frequency deviation based on the PEAK and VALLEY levels, as mentioned above.

As an alternative, the ZIF receiver circuit 10 is frequency synthesized by a synthesizer 62 which is coupled between the first local oscillator 17, mixer 18 and phase shifter 20. The frequency synthesizer 62 converts the frequency of the signal generated by the first local oscillator 17, called the mixing signal, to one of a plurality of frequencies.

Figure 2:
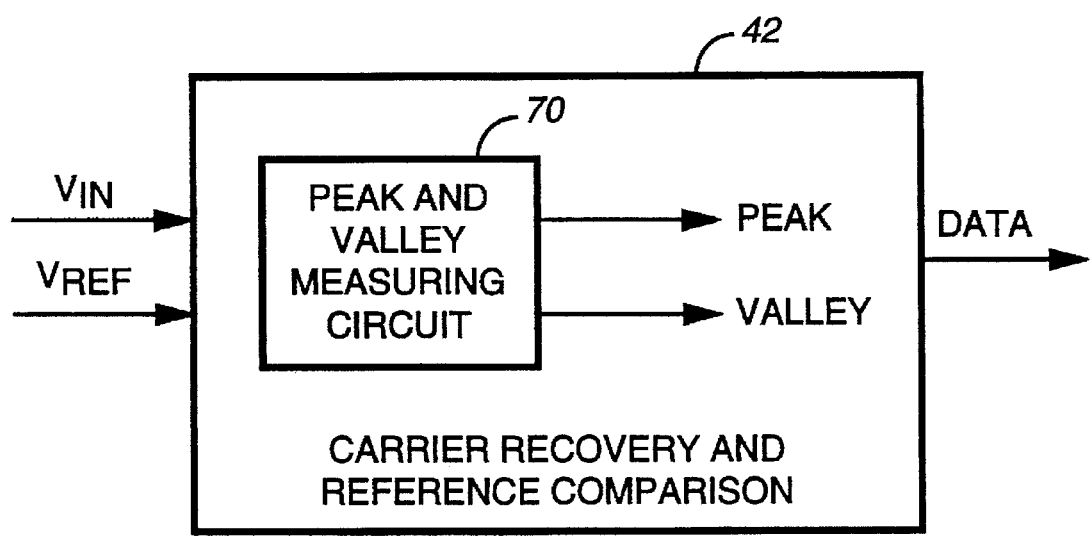
FIG. 2 is an electrical block diagram of a carrier recovery and comparison circuit including a peak and valley measuring circuit.

FIG. 2 illustrates the carrier recovery and reference comparison circuit 42 in greater detail, and which includes a peak and valley measuring circuit 70. A peak and valley measuring circuit 70 is well known in the art, and determines values representative of the relative minimum and maximum peaks in the output of the post detection filter 38.

The output of the peak and valley measuring circuit 70 are, for example, digital counter values PEAK and VALLEY, which are representative of the relative maximum (peak) and relative minimum (valley) of the recovered audio signal relative to Vref, and are used to compute the frequency deviation of the received signal. These values are made available to the control module 50 via the interface circuit 52. The control module 50 computes the frequency deviation of the received signal based on the PEAK and VALLEY values according to the equation DEV=(PEAK+VALLEY)/2.

Those skilled in the art appreciate that, with no input signal applied to a frequency modulation (FM) receiver having an IF limiter and an analog demodulator, the output of the analog demodulator is very large in amplitude, and is completely noise. At the output of the PDF 38, the measured peak-to-peak deviation of the recovered audio signal, as determined by the carrier recovery and reference comparison circuit 42 and control module 50, is very large, approaching the double-sided bandwidth of BBF's 22 and 24. The measured peak-to-peak deviation of the recovered audio signal may be slightly less than the double-sided bandwidth of the BBF's 22 and 24, due to the action of the PDF 38.

As a desired FM signal of increasing amplitude is received by the receiver, the measured peak-to-peak deviation of the recovered audio signal gradually decreases, eventually approaching that of the transmitted signal at high levels.

This relationship between the measured deviation and the strength of the received signal is used to an advantage in connection with the present invention, in order to reduce the number of false positive baud detection decisions. The false positive baud detection decisions occur due to the statistics of random noise present in the recovered audio signal when no signal is present at the receiver input. By using the measured peak-to-peak deviation information, a positive baud detection decision made on noise can be corrected.

For high baud rate signals in narrow band frequency shift keying, for example, the signal-to-noise ratio present at the demodulator must be significantly greater than 0 dB to achieve an acceptable low bit error rate. (The received signal strength required to just equal this bit error rate is referred to as threshold sensitivity.) The measured peak-to-peak deviation of the recovered audio signal may, therefore, approach that of the transmitted signal before an acceptably low bit error rate is achieved. Thus, it is possible to establish a measured deviation threshold between the transmitted deviation, and the measured deviation when no signal is present, such that a signal having a measured deviation at this threshold is below threshold sensitivity. As a result, the baud detection method according to the present invention does not impair receiver sensitivity.

Figure 3:
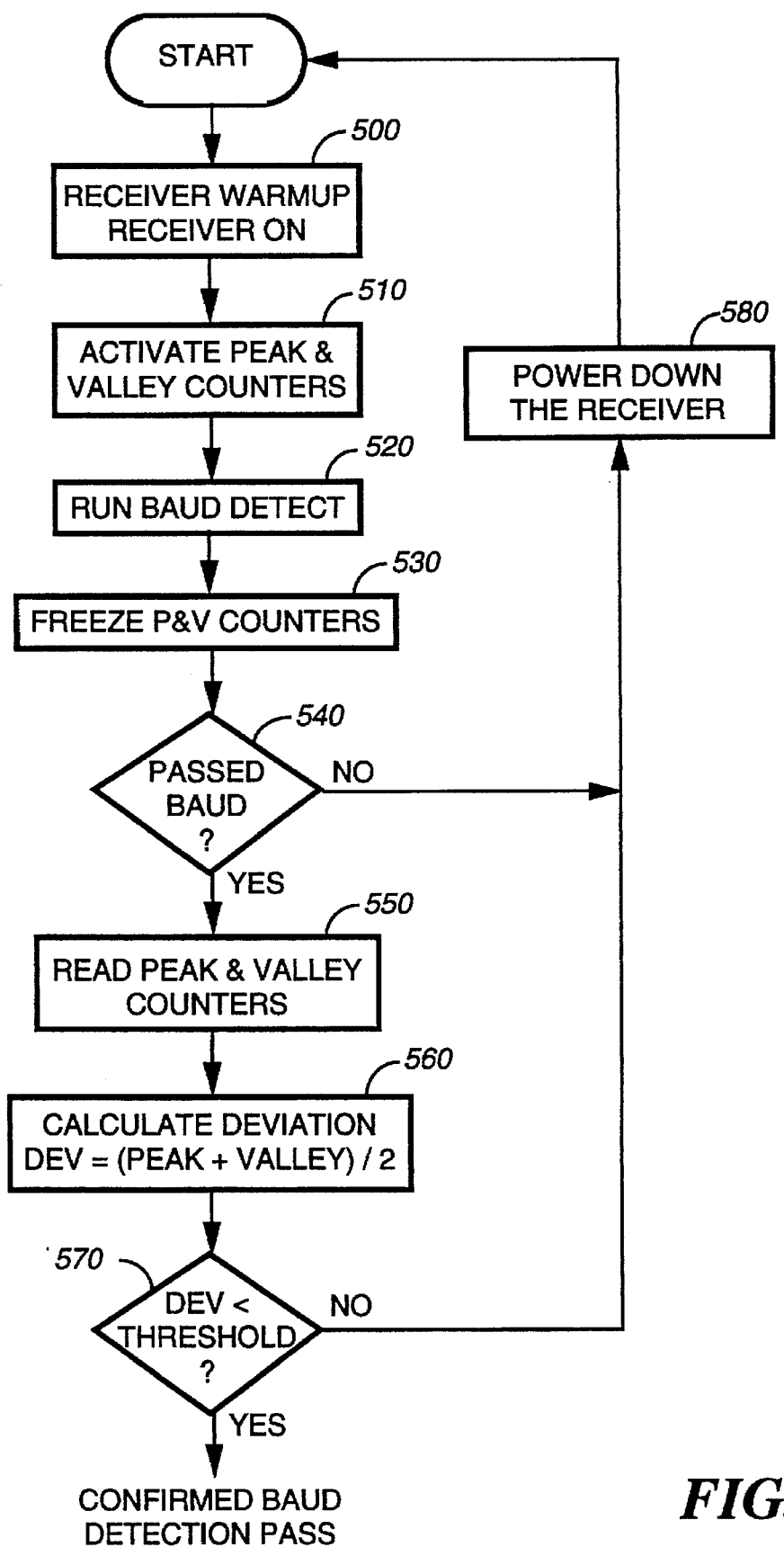
FIG. 3 is a flow chart diagram illustrating a baud detection method according to a first embodiment the present invention.

FIG. 3 illustrates a baud detection method according to a first embodiment the present invention. In step 500 the receiver circuit 10 is strobed ON to allow for adequate warm-up. When the receiver circuit 10 is ON, the frequency modulated signal received by the receiver circuit 10 is ultimately demodulated and a demodulated signal is generated by the PLL demodulator 36, which is filtered by the PDF 38.

In step 510, the peak and valley measuring circuit 70 is activated and begins to measure the peaks and valleys of the demodulated signal. In step 520, a conventional baud detection algorithm on the SIGNAL DATA at the output of the data limiter 41 is run. See commonly assigned U.S. Pat. No. 5,095,498 to Deluca et al. for an example of a suitable baud detection algorithm.

In step 530, the PEAK and VALLEY values of the peak and valley measuring circuit 70 after the baud detection in step 520 is made, are stored.

In step 540, it is preliminarily determined whether the baud rate of the signal received by the receiver circuit, as determined in step 520, matches a predetermined baud rate. If not, then the procedure optionally powers down the receiver in step 580, and then restarts from step 500. Otherwise, in step 550, the PEAK and VALLEY values which were stored in step 530 are read. Then, in step 560, the frequency deviation measurement DEV is computed on the basis of the PEAK and VALLEY values read in step 550. Ultimately, in step 570, if the deviation DEV is less than a predetermined threshold called the frequency deviation threshold, then it is declared (confirmed) that the baud rate of the signal received by the receiver circuit 10 matches the predetermined baud rate. An example of a suitable threshold for a paging channel is 10 kHz. The 10 kHz threshold is an example only, and the threshold is optimally somewhere between the transmitted signal deviation and signal deviation observed when the receiver is not "quieted".

When a negative determination is made in steps 540 and 570, the receiver is optionally powered down in step 580 to save battery power. It is very common that the receiver is programmed to periodically power up and attempt to make a baud rate match, and thus the procedure restarts from step 500 at the next programmed instant of time. Alternatively, the procedure restarts when the receiver is powered up manually by the user after being manually shut down.

Step 570 is a confirmation step to confirm that the received signal was not significantly corrupted by noise or other interference that would otherwise create a frequency deviation greater than a predetermined threshold. Thus, the risk is minimized that a positive baud detection decision is made when in fact the signal is corrupted by noise enough to make the received information unreliable. False baud rate detection on noise is dramatically reduced.

The improved baud detection method of FIG. 3 is capable of making better baud detection decisions based on the PEAK and VALLEY values that contain deviation information about the received signal, and thereby reduces falsing. In particular, for high speed paging applications, the PEAK and VALLEY values are different when a signal is present at or above threshold, than when a signal is not present, due to quieting of the receiver. For example, a 6400-baud, four-level paging threshold is at a signal-to-noise ratio of 5–8 dB, and faster codes require even larger signal-to-noise ratios. The difference between the zero dB signal-to-noise ratio level and the paging threshold level is exploited to help identify noise falsing situations with little or no effect on received signal sensitivity.

As is known in the art, baud rate detection is a tool by which it is determined whether a received signal is the desired received signal. Thus, it is frequently utilized prior to decoding the bits carried in the received signal to ensure that the proper signal is decoded and not noise or a signal so corrupted by noise that the data carried in the signal is not sufficiently reliable for decoding.

Figure 4:
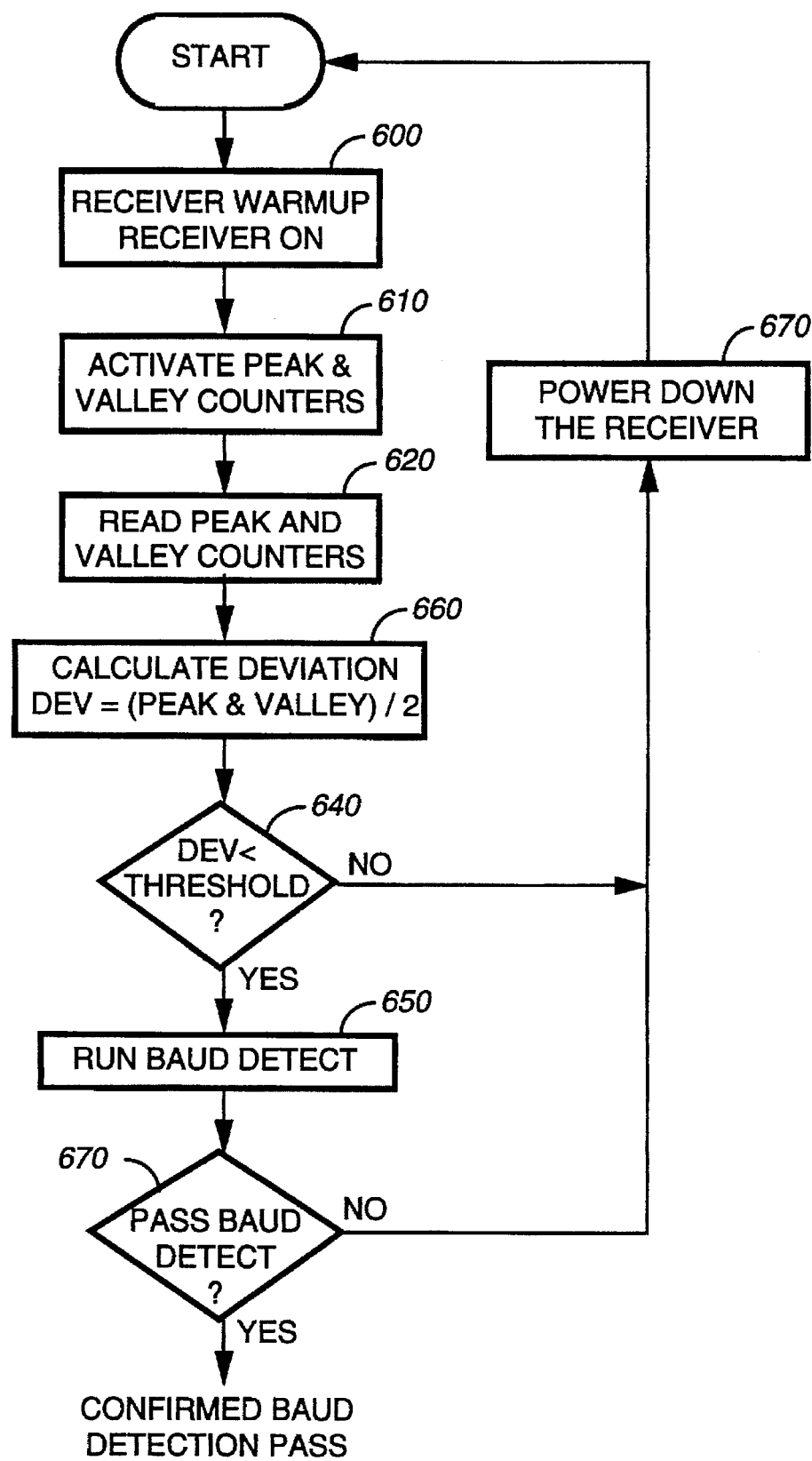
FIG. 4 is a flow chart diagram illustrating a baud detection method according to a second embodiment the present invention.

In accordance with the present invention, the frequency deviation measurement, or measurement of other parameter associated with the received FM signal, is optionally performed prior to the baud detection step and baud determination step. With reference to FIG. 4, the receiver warmup step 600 is the same as the receiver warmup step 500 of FIG. 3 and activation of peak and valley counters in step 610 is the same as step 510 of FIG. 3. In step 620, the peak and valley counters are read. In step 630, the frequency deviation measurement is calculated based on the peak and valley values. Next, in step 640, the frequency deviation measurement DEV is compared with a frequency deviation threshold. If the frequency deviation measurement calculated in step 630 is less than the threshold, then baud detection is initiated in step 650. In step 660, the detected baud rate is compared with a predetermined baud rate and if it matches, confirmed baud rate detection is made. Otherwise, if the tests in steps 640 or 660 fail, the receiver is optionally powered down in step 670 and the procedure restarts at the next programmed receiver power up instant of time, or when manually powered up after being manually powered down.

The advantage of the procedure of FIG. 4 is that baud detection, which requires a significantly longer period of time to perform and confirm the detected baud rate matches, is not executed if the frequency deviation measurement is unacceptable. The frequency deviation measurement takes a few bits to determine whereas baud detection requires ten or more bits to detect and compare with a predetermined rate. Thus, baud detection consumes more battery power in the receiver. Consequently, battery power is saved in the receiver by disqualifying the need to run baud detection when the frequency deviation measurement is unacceptable, indicative of noise or an otherwise corrupted signal which could not be synchronized to and decoded.

In sum, the present invention involves conditioning the detection of baud rate and determination of a baud rate match, upon a parameter of the received FM signal other than baud rate.

The procedure according to the first embodiment involves preliminarily determining whether a baud rate of an FM signal received by a receiver matches a predetermined baud rate; if it is preliminarily determined that the baud rate of the FM signal matches the predetermined baud rate, determining a parameter other than the baud rate of the FM signal received by the receiver; and confirming that the baud rate of the received FM signal matches the predetermined baud rate if the parameter satisfies a predetermined criterion.

The procedure according to the second embodiment involves determining a parameter other than baud rate of an FM signal received by a receiver; determining whether the parameter satisfies a predetermined criterion; and determining whether the baud rate of the FM signal received by the receiver matches the predetermined baud rate when the parameter other than the baud rate satisfies the predetermined criterion.

In accordance with the present invention, the control module 50 makes decisions concerning the reception of the received signal. The decision process implemented by the control module 50 is, for example, embodied by software executed by a microprocessor controller. The control module 50 is also responsible for computing the frequency deviation measurement DEV based on the PEAK and VALLEY values.

Figure 5:
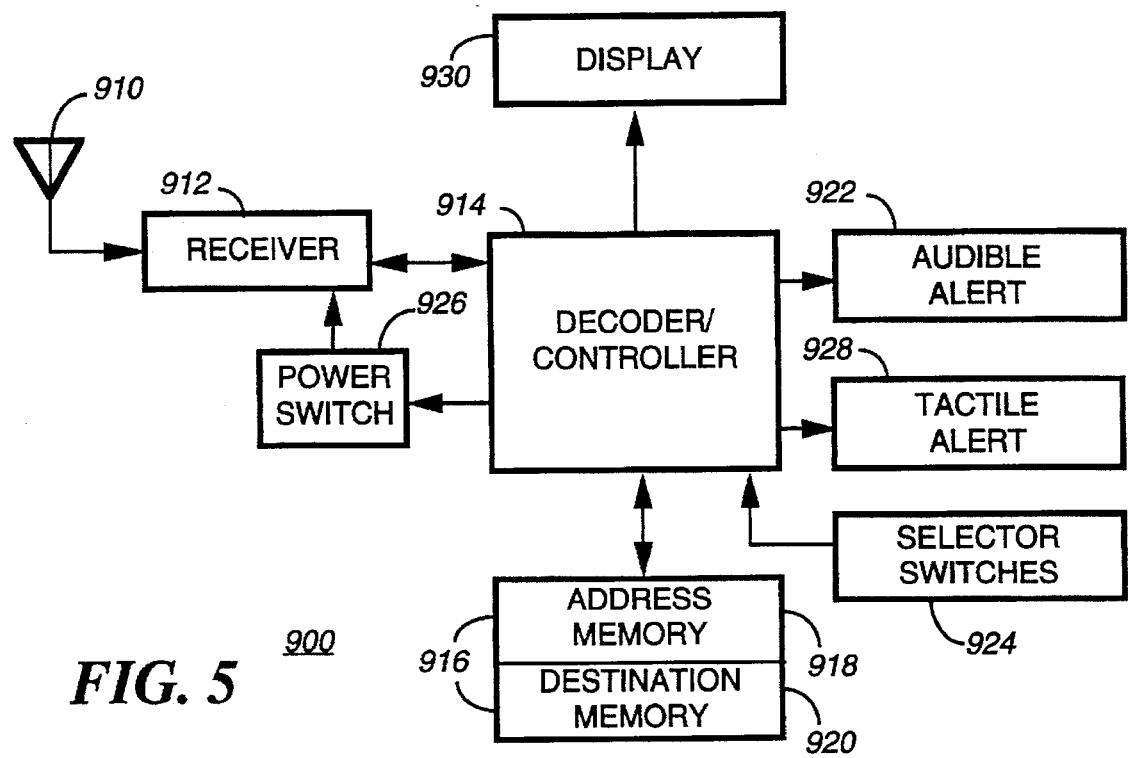
FIG. 5 is an electrical block diagram of a selective call receiver in accordance with the present invention.

A receiver circuit using the baud detection methods according to the present invention is useful in many applications. FIG. 5 is an example of an application comprising a selective call receiver or pager.

The selective call receiver 900 comprises an antenna 910, a receiver circuit 912, a decoder/controller 914, and a code plug memory 916 including an address memory 918 and a destination memory 920. The code plug memory 916 is programmable by a remote programming device, as is well known in the art. In addition, various alert devices are provided, such as the audible alert 922 or tactile alert 928. A power switch 926 is also provided to activate and de-activate certain components of the selective call receiver 900 under control of the decoder/controller 914. The receiver 912 comprises the ZIF receiver circuit 10 or other receiver circuit implementing the baud detection method according to the present invention.

User input into the selective call receiver is by way of selector switches 924. A menu of various user programmable features is accessed via the switches, through the use of menu information displayed on the display 930. The selector switches 924 allow adjustment of user programmable features.

Figure 6:
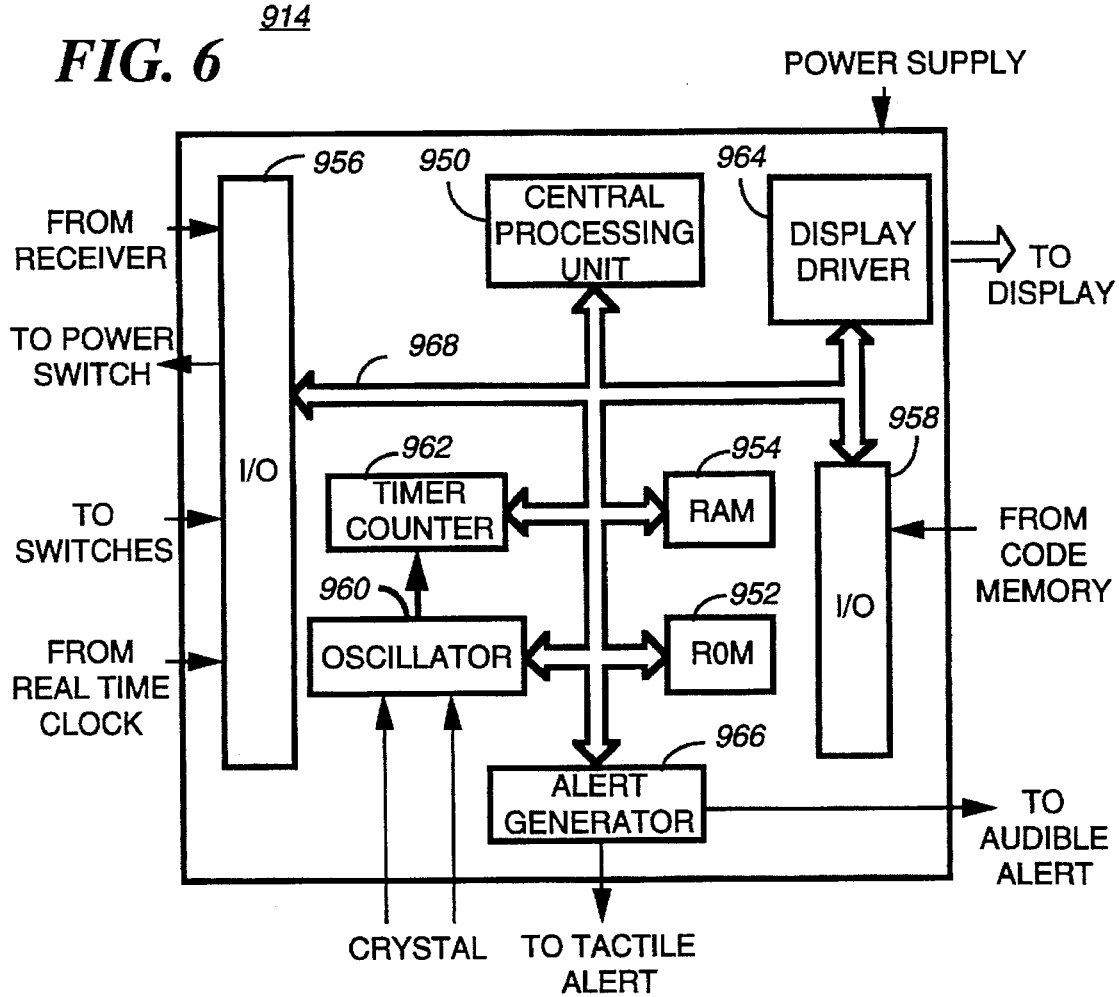
FIG. 6 is an electrical block diagram of a decoder/microcontroller of the selective call receiver in accordance with the present invention.

FIG. 6 illustrates the decoder/controller 914 in greater detail. A detailed explanation of these components is not needed for purposes of understanding the present invention. Briefly, at its heart, the decoder/controller 914 comprises a central processing unit 950 which processes software instructions stored in a ROM 952 and/or RAM 954. Data flow into and out of the decoder/controller 914 is controlled by input/output (I/O) ports 956 and 958. A timer counter 962 is connected to the oscillator 960 for certain timing functions. The central processing unit drives the display 930 via a display driver 964. An alert generator 966 generates triggering signals for the alert devices, such as the audible alert 922 and tactile alert 928 shown in FIG. 5. The various components of the central processing unit 950 communicate over the bus 968.

Firmware for executing the baud detection methods of the present invention is stored in the ROM 952 or RAM 954 and executed by the central processing unit 950. Thus, the decoder/controller 914 performs the baud detection and other functions otherwise performed in a separate circuit, such as control module 50, and the selective call receiver signal decoding functions normally performed by a decoder/controller.

Furthermore, the functions of the decoder/controller 914 and the control module can be integrated into a single microprocessor or into a single digital signal processor.

The above description is intended by way of example only and is not intended to limit the present invention in any way except as set forth in the following claims.

What is claimed is:

1. A method for determining whether a baud rate of a frequency modulated (FM) signal received by a receiver matches a predetermined baud rate, the method comprising steps of:

preliminarily determining whether a baud rate of the FM signal received by the receiver matches a predetermined baud rate;

determining a parameter unrelated to the baud rate of the FM signal received by the receiver if it is preliminarily determined that its baud rate matches the predetermined baud rate; and finally determining that the baud rate of the FM signal received by the receiver matches the predetermined baud rate if said parameter satisfies a predetermined criterion.

2. The method of claim 1, and further comprising the step of powering down the receiver when it is determined that the parameter unrelated to the baud rate does not satisfy the predetermined criterion.

3. The method of claim 1, wherein the step of determining a parameter unrelated to the baud rate of the FM signal received by the receiver comprises measuring a peak and a valley of a demodulated signal which is generated by demodulating the received FM signal, and generating a frequency deviation measurement based on the peak and the valley.

4. The method of claim 3, wherein the step of finally determining that the baud rate of the FM signal received by the receiver matches the predetermined baud rate comprises comparing the frequency deviation measurement with a predetermined threshold and if the frequency deviation measurement is less than said predetermined threshold, declaring that the baud rate of the FM signal received by the receiver matches the predetermined baud rate.

5. A method for determining whether a baud rate of a frequency modulated (FM) signal received by a receiver matches a predetermined baud rate, the method comprising steps of:

detecting a parameter unrelated to the baud rate of the FM signal received by a receiver;

determining whether said parameter satisfies a predetermined criterion; and determining whether the baud rate of the FM signal received by the receiver matches a predetermined baud rate when the parameter satisfies a predetermined criterion.

6. The method of claim 5, wherein the step of determining whether the baud rate of the FM signal received by the receiver matches the predetermined baud rate is not executed when the parameter unrelated to the baud rate does not satisfy the predetermined criterion.

7. The method of claim 6, and further comprising the step of powering down the receiver when it is determined that the parameter does not satisfy the predetermined criterion.

8. The method of claim 5, wherein the step of determining the parameter unrelated to the baud rate comprises measuring a peak and a valley of a demodulated signal which is generated by demodulating the FM signal received by the receiver and generating a frequency deviation measurement based on the peak and the valley.

9. The method of claim 8, wherein the step of determining whether the parameter of the FM signal received by the receiver satisfies a predetermined criterion further comprises comparing the frequency deviation measurement with a frequency deviation threshold to determine if the frequency deviation measurement is less than a frequency deviation threshold.

10. A receiver device for receiving a frequency modulated (FM) signal detected by an antenna, the receiver comprising:

a receiver circuit for receiving an FM signal and generating a demodulated signal; and a control module coupled to the receiver circuit and preliminarily determining whether a baud rate of the FM signal matches a predetermined baud rate, the control module determining a parameter unrelated to the baud rate if it is preliminarily determined that the baud rate of the FM signal matches the predetermined baud rate, and finally determining that the baud rate of the FM signal matches the predetermined baud rate if the parameter satisfies a predetermined criterion.

11. The receiver device of claim 10, wherein the control module powers down the receiver circuit when the parameter does not satisfy the predetermined criterion.

12. The receiver device of claim 10, and further comprising a peak and valley measuring circuit for measuring a peak and a valley of the demodulated signal, wherein the control module is coupled to the peak and valley measuring circuit for generating a frequency deviation measurement based on the peak and the valley.

13. The receiver device of claim 12, wherein the parameter unrelated to the baud rate is the frequency deviation measurement, and wherein the control module compares the frequency deviation measurement with the frequency deviation threshold, and the control module finally determines that the baud rate matches the predetermined baud rate when the frequency deviation measurement is less than the frequency deviation threshold.

14. A selective call receiver comprising the receiver device of claim 10.

15. A receiver device for receiving a frequency modulated (FM) signal detected by an antenna, the receiver device comprising:

a receiver circuit for demodulating a received FM signal and generating a demodulated signal; and a control module coupled to the receiver circuit for preliminarily determining a parameter unrelated to a baud rate of the received FM signal and determining whether the parameter satisfies a predetermined criterion, and when the parameter satisfies the predetermined criterion the control module determining whether the baud rate of the received FM signal matches a predetermined baud rate.

16. The receiver device of claim 15, wherein the control module does not determine the baud rate of the received FM signal when the parameter does not satisfy the predetermined criterion.

17. The receiver device of claim 16, wherein the control module powers down the receiver circuit when the parameter does not satisfy the predetermined criterion.

18. The receiver device of claim 15, and further comprising a peak and valley measuring circuit for measuring a peak and a valley of the demodulated signal, wherein the control module is coupled to the peak and valley measuring circuit for generating a frequency deviation measurement based on the peak and the valley.

19. The receiver device of claim 18, wherein the parameter unrelated to the baud rate is the frequency deviation measurement, and wherein the control module compares the frequency deviation measurement with the frequency deviation threshold.

* * * * *